US008767436B2

(12) United States Patent
Scalia et al.

(10) Patent No.: US 8,767,436 B2
(45) Date of Patent: Jul. 1, 2014

(54) MEMORY SUPPORT PROVIDED WITH MEMORY ELEMENTS OF FERROELECTRIC MATERIAL AND NON-DESTRUCTIVE READING METHOD THEREOF

(75) Inventors: Antonio Maria Scalia, Catania (IT); Maurizio Greco, Acicastello (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/362,478

(22) Filed: Jan. 31, 2012

(65) Prior Publication Data

US 2012/0195095 A1 Aug. 2, 2012

(30) Foreign Application Priority Data

Feb. 1, 2011 (IT) .......................... TO2011A000082
Mar. 1, 2011 (IT) .......................... TO2011A000181

(51) Int. Cl.
G11C 11/22 (2006.01)

(52) U.S. Cl.
USPC ...................................................... 365/145

(58) Field of Classification Search
USPC .......................................... 365/145; 257/295
See application file for complete search history.

(56) References Cited

U.S. PATENT DOCUMENTS

| 4,888,733 | A | 12/1989 | Mobley |
| 5,086,412 | A | 2/1992 | Jaffe et al. |
| 5,999,438 | A * | 12/1999 | Ohsawa ........................ 365/145 |
| 6,067,244 | A | 5/2000 | Ma et al. |
| 6,819,583 | B2 | 11/2004 | Hsu et al. |
| 6,856,534 | B2 * | 2/2005 | Rodriguez et al. ............ 365/145 |
| 6,967,858 | B2 * | 11/2005 | Kang ............................ 365/145 |
| 6,995,998 | B2 * | 2/2006 | Kang ............................ 365/145 |
| 2001/0017386 | A1 * | 8/2001 | Bachhofer et al. ............ 257/315 |
| 2003/0185040 | A1 | 10/2003 | Rickes et al. |
| 2004/0076057 | A1 * | 4/2004 | Goebel et al. ................. 365/202 |
| 2005/0219892 | A1 | 10/2005 | Lai et al. |
| 2007/0189056 | A1 * | 8/2007 | Joo et al. ....................... 365/145 |
| 2009/0290404 | A1 * | 11/2009 | Kaneko et al. ................ 365/145 |

OTHER PUBLICATIONS

Cho et al., "Terabit inch-2 ferroelectric data storage using scanning nonlinear dielectric microscopy nanodomain engineering system", Institute of Physics Publishing, Nanotechnology No. 14, 2003, pp. 637-642,.
Kato et al., "0.18-μm nondestructive readout FeRAM using charge compensation technique", IEEE Transactions on electron devices, vol. 52, No. 12, Dec. 2005, pp. 2616-2621.

* cited by examiner

Primary Examiner — Huan Hoang
Assistant Examiner — Jay Radke
(74) Attorney, Agent, or Firm — Allen, Dyer, Doppelt, Milbrath & Gilchrist, P.A.

(57) ABSTRACT

A method for non-destructive reading of logic data stored in a memory includes applying to a first wordline a reading voltage so as not to cause a variation of the stable state of polarization of a layer of ferroelectric material, and generating a difference of potential between first and second bitlines. An output current is generated comparing the output current with a plurality of comparison values, and determining the logic value of the logic data to be read on the basis of the comparison.

14 Claims, 7 Drawing Sheets

MEMORY SUPPORT PROVIDED WITH MEMORY ELEMENTS OF FERROELECTRIC MATERIAL AND NON-DESTRUCTIVE READING METHOD THEREOF

FIELD OF THE INVENTION

The present invention relates to a memory provided with memory elements of ferroelectric material and to a non-destructive reading method therefore.

BACKGROUND OF THE INVENTION

In the context of storage systems the need is felt to reach high storage capacities with high data-transfer rates (bitrates), while at the same time reducing the manufacturing costs. Some storage systems currently used are, for example, hard-disk drives (with miniaturized dimensions) and flash RAMs, present intrinsic technological limits with respect to an increase of the data-storage capacity and of the read/write speed, as well as a reduction of their dimensions.

Among prior attempts, storage systems that use a storage medium made of ferroelectric material, in which reading/writing of individual bits is made by interacting with the ferroelectric domains of the ferroelectric material, are promising.

As is known, a ferroelectric material possesses a spontaneous polarization, which can be reversed by an applied electrical field. As shown in FIG. 1, the material moreover presents a hysteresis cycle in the diagram of the polarization charge Q (or, equivalently, of the polarization P) as a function of the applied voltage V, and by exploiting this, it is possible to store information in the form of bits. In particular, in the absence of a biasing voltage imparted on the medium (V=0), there exist two points of the diagram in the stable state (designated by "b" and "e") that have different polarization, in particular equal and opposite. The points can remain in the stable state for some years, thus maintaining the binary datum stored (for example point "b", with positive charge $+Q_H$, corresponds to a "0", while point "e", with negative charge $-Q_H$, corresponds to a "1").

The writing operations envisage application to the ferroelectric medium of a positive or negative higher in magnitude than a coercive voltage $V_{coe}$ that is characteristic of the ferroelectric material. In this case, a positive charge $+Q_H$, or negative charge $-Q_H$ (this basically corresponds to a displacement along the diagram from point "e" to point "b" passing through point "a", or else from point "b" to point "e" passing through point "d") is stored in the material. A voltage having an absolute value that is lower than the coercive voltage $V_{coe}$ does not, instead, cause a stable variation of the charge stored.

The data-reading techniques commonly used are based on a destructive operation, which envisages erasure of the data read. In summary, a (positive or negative) voltage having an amplitude greater than that of the coercive voltage $V_{coe}$ is applied to the ferroelectric material, thus carrying out in practice a writing operation, and the occurrence or otherwise of a reversal of polarity of the ferroelectric material, is detected. For this purpose, the existence of or otherwise of an appreciable current that flows in the ferroelectric material is detected. The application of a positive (or negative) voltage causes reversal of just the ferroelectric domains in which a negative charge $-Q_H$ (or positive charge $+Q_H$) has previously been stored.

The main issue of this reading technique is linked to the fact that the reading operations are destructive; i.e., they imply removal of the information stored previously and hence the impossibility of carrying out subsequent readings of the data themselves, without there having previously been a re-writing of the data read. In fact, reading of a portion of the memory corresponds to writing in the memory portion of a sequence of charges that are all positive (or all negative, in the case where a negative reading voltage is used). Consequently, during reading the flow of the data read must be stored in a memory buffer, and a writing operation is then necessary for restoring the original information.

This reading technique entails a considerable expenditure of time and power, and basically constitutes a bottleneck for the current ferroelectric storage systems, in particular in regards to the bitrate.

In order to overcome these limitations, some techniques of non-destructive reading of the data stored have been proposed.

For example in Cho et al., "Terabit inch$^{-2}$ ferroelectric data storage using scanning nonlinear dielectric microscopy nanodomain engineering system", Nanotechnology No. 14, 2003, 637-642, Institute of Physics Publishing, a sinusoidal signal is applied to a ring electrode, which induces an oscillation in a resonant circuit that includes the ferroelectric medium in which the information bit is stored. A demodulator detects the harmonics of the induced oscillation, the phases of which are correlated to the information bit stored, on account of the different behaviour of the high-order nonlinear permittivities of the ferroelectric material in the stable points of the polarization diagram.

In Kato et al., "0.18-μm nondestructive readout FeRAM using charge compensation technique", IEEE Transactions on electron devices, Vol. 52 No. 12, December 2005, a reading circuit is described, which envisages the connection in series of a ferroelectric capacitor to the gate terminal of a reading MOS transistor. If a reading pulse is applied, the charge stored in the capacitor biases the gate terminal of the MOS transistor in a different way according to the polarization state stored previously, thus varying the conductivity of the conduction channel thereof. Next, the datum stored is read by detecting the current that flows between the current-conduction terminals of the transistor itself, in a static way, by means of a sense amplifier.

The aforesaid reading techniques, albeit presenting the advantage of not being destructive and hence of not requiring re-writing of the data read, are not altogether satisfactory with respect to the constructional complexity and their operation. Other documents that describe memories comprising ferroelectric elements and corresponding read/write methods are U.S. Pat. No. 5,086,412, U.S. Pat. No. 6,819,583, and U.S. Pat. No. 4,888,733. However, each of the memory cells according to the documents comprises one or more transistors for direct addressing of the memory cell, and at least one additional ferroelectric capacitor for storage of the charge that represents the logic information (bit "1" or bit "0") to be stored.

Also these approaches are not optimal in terms of occupation of area and operation. For example, some of these memories present issue with coupling between adjacent cells during the writing operations.

SUMMARY OF THE INVENTION

The aim of the present invention is to provide a memory having elements of ferroelectric material, and a non-destructive reading method thereof, which will enable the aforementioned drawbacks and disadvantages to be overcome.

According to the present invention a memory provided with elements made of ferroelectric material and a corresponding non-destructive reading method are consequently provided, as defined in the annexed claims.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF THE PREFERRED EMBODIMENTS

Figure 2:
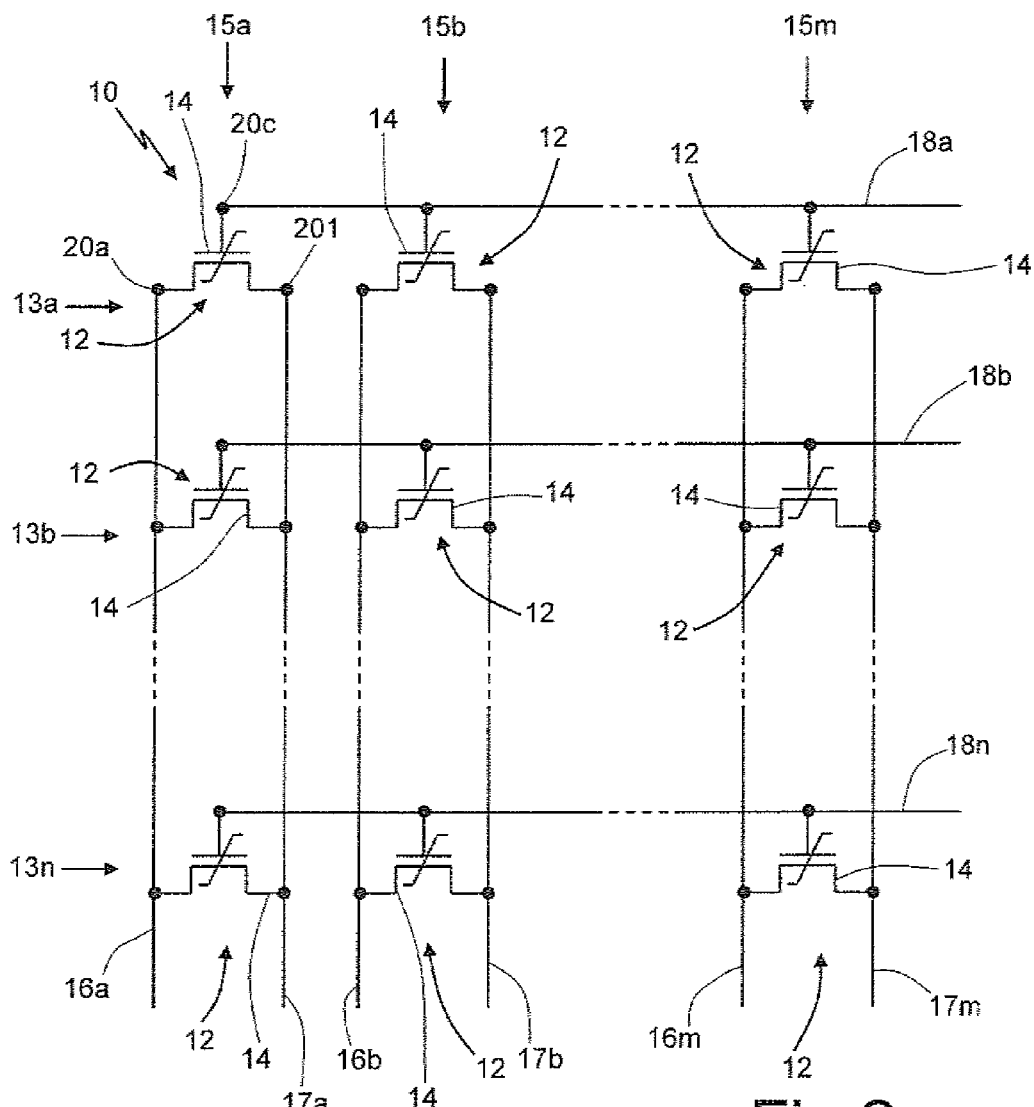
FIG. 2 shows a portion of a memory in which each memory cell is formed by a single FeFET, in accordance with the present invention.

Designated by the reference number 10 in FIG. 2 is a portion of a memory (not shown as a whole) comprising a plurality of memory cells 12 arranged to form an array having a plurality of rows 13a, 13b, ..., 13n (defined by a plurality of respective wordlines) and a plurality of columns 15a, 15b, ..., 15m (defined by a plurality of respective pairs of bitlines). It is evident that the memory portion 10 can comprise any number of rows and columns. In general, the memory portion 10 defines an array of memory cells 12 of dimensions (rows-columns) equal to n·m, with n and m integer numbers chosen as desired.

Each memory cell 12 comprises an electronic device having the function of co-operating in the selection of the respective memory cell 12 (for the steps of reading/writing of the respective memory cell) and of the element for storage of data (in particular, a logic datum "1" or "0"). In the following description the logic value "1" identifies a high logic value, whilst the logic value "0" identifies a low logic value. The voltage levels associated to the logic values "1" and "0" depend upon the physical structure of the components used, and their exact value is indifferent for the purposes of the present invention.

According to an embodiment of the present invention, the electronic device is a transistor 14, in particular of a FeFET (ferroelectric field-effect transistor) type. The memory cell 12 thus formed comprising a single FeFET is also known as "1T" memory cell.

Each transistor 14 (see also FIGS. 3a-3c) has a first conduction terminal (source terminal) 20a, a second conduction terminal (drain terminal) 20b, and a control terminal (gate terminal) 20c. The transistors 14 belonging to one and the same column 15a-m have the respective first conduction terminals 20a connected to one and the same first bitline 16a, 16b, ..., 16m, and the respective second conduction terminals 20b connected to one and the same second bitline 17a, 17b, ..., 17c. In this way, for each column 15a-m, the transistors 14 are connected to one another in parallel.

For each row 13a-n, the control terminals 20c of each transistor 14 are connected to one and the same wordline 18a, 18b, ..., 18n.

Figure 3A:
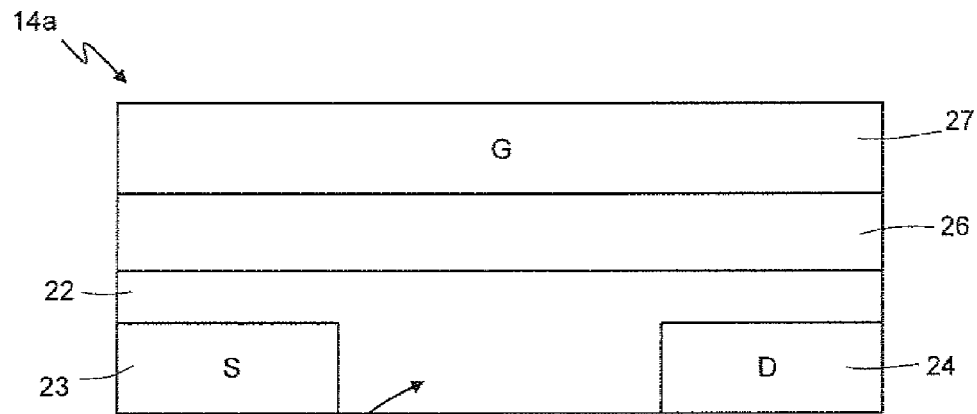
FIGS. 3a-3c show embodiments that are alternative to one another of FeFETs that can be used in the memory portion of FIG. 2.
Figure 3B:
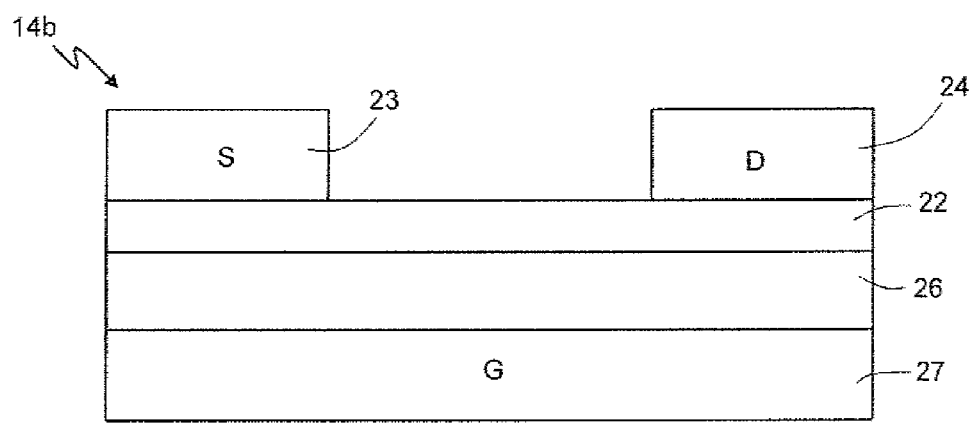
Figure 3C:
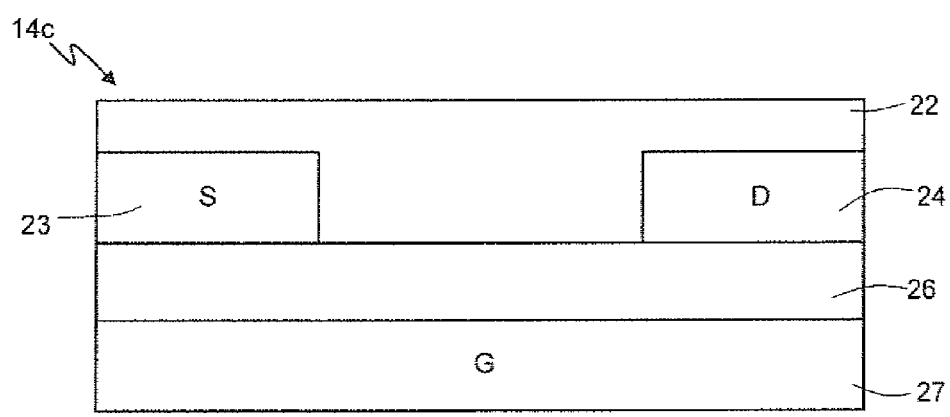

FIGS. 3a-3c show embodiments that are alternative to one another of a FeFET that can be used as memory cell 12 of the memory portion 10 of FIG. 2, in particular a single-transistor (1T) memory cell.

In particular, FIG. 3a shows, in cross-sectional view, a transistor 14a of a FeFET type with a structure of a top-gate type. The transistor 14a comprises: a semiconductor layer 22; a first conduction terminal 23, made of conductive material, designed to form a source terminal of the transistor 14a, formed partially in the semiconductor layer 22; a second conduction terminal 24, made of conductive material, designed to form a drain terminal of the transistor 14a, formed partially in the semiconductor layer 22 at a distance from the first conduction terminal 23 and laterally in contact with the first conduction terminal 23 by means of a portion of the semiconductor layer 22; a ferroelectric layer 26, preferably made of organic polymeric ferroelectric material, formed in contact with the semiconductor layer 22 and separated from the first and second conduction terminals 23, 24 by means of the semiconductor layer 22; and a control terminal 27 (gate terminal), made of conductive material, formed on, and in contact with, the ferroelectric layer 26. In this way, the ferroelectric layer 26 extends between the control terminal 27 and the semiconductor layer 22 in which the first and second conduction terminals 23, 24 are formed. The ferroelectric layer 26 has, in use, the function of memory element designed to store the logic datum that is to be stored. The transistor 14a can be used in the memory portion 10 of FIG. 2 to form the memory cell 12. In this case, the first conduction terminal 23 corresponds to the terminal 20a, the second conduction terminal 24 corresponds to the terminal 20b, and the control terminal 27 corresponds to the terminal 20c of the transistor 14 of FIG. 2.

In order to operate the transistor 14a as memory element, in particular, for writing a logic datum in the memory element, a voltage is applied across the control terminal 27 and both of the conduction terminals 23, 24 in order to modify the state of polarization of the ferroelectric layer 26. By setting a pre-set and known state of polarization of the ferroelectric layer 26 the operation of writing of the logic datum is carried out. In particular, a first polarization state corresponds to a first logic value, whilst a second polarization state is associated to a second logic value. As is known, the polarization state set remains in the ferroelectric layer 26 also following upon removal of the applied voltage.

In order to read a logic datum stored in the memory element formed by the transistor 14a, a voltage is applied across the first and second conduction terminals 23, 24 and the current that flows between the terminals 23, 24 is detected. The current that flows between the first and second conduction terminals 23, 24 is affected by the state of polarization of the ferroelectric layer 26, and the current value detected can thus be associated to the logic value stored. With reference to FIG. 3a, the portion 22a of the semiconductor layer 22 comprised between the first and second conduction terminals 23, 24 has, in use during reading operations, the function of channel region of the transistor 14a, in which the charge carriers flow.

FIG. 3b shows, in cross-sectional view, a transistor 14b of a FeFET type, having a structure of a bottom-gate/top-contact type. The transistor 14b of FIG. 3b comprises, in a way similar to the transistor 14a of FIG. 3a (elements that are in common are designated by the same reference numbers): the control terminal 27, made of conductive material, having the function of gate terminal of the transistor 14b; the semiconductor layer 22; the layer of ferroelectric material 26, preferably made of organic polymeric ferroelectric material, which extends between the semiconductor layer 22 and the control terminal 27; the first conduction terminal 23, which extends on top of and in electrical contact with the semiconductor layer 22; and the second conduction terminal 24, which extends on top of and in electrical contact with the semiconductor layer 22, at a distance from the first conduction terminal 23. The embodiment of FIG. 3b differs from the embodiment of FIG. 3a in so far as the first and second conduction terminals 23, 24 do not extend within the semiconductor layer 22, but extend on top of it. Operation of the transistor 14b for the operations of writing and reading of a logic datum is similar to what is described with reference to the transistor 14a of FIG. 3a, and the transistor 14b can hence be used as memory cell 12 in the memory portion 10 of FIG. 2.

FIG. 3c shows, in cross-sectional view, a transistor 14c of a FeFET type, having a structure of the bottom-gate type, according to a further embodiment alternative to the one shown in FIGS. 3a, 3b. The transistor 14c of FIG. 3c has a structure similar to that of the transistor 14b of FIG. 3b, but differs from the latter on account of the presence of a semiconductor layer 22, which extends between, and on top of the first and second contact terminals 23, 24. In order to access the first and second conduction terminals 23, 24 appropriate contacts (not shown) must be formed, which extend through the portion of the semiconductor layer formed on top of the first and second conduction terminals 23, 24. Operation of the transistor 14c, for the operations of writing and reading of a logic datum, is similar to what has been described with reference to the transistor 14a of FIG. 3a, and the transistor 14c can hence be used as memory cell 12 in the memory portion 10 of FIG. 2.

Figure 4:
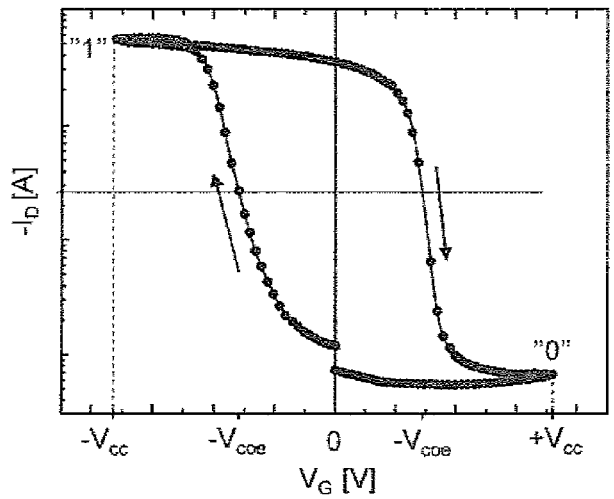
FIG. 4 shows an example of transcharacteristic curve for a generic FeFET, in accordance with the present invention.

FIG. 4 shows a transcharacteristic curve typical of a FeFET. The axis of the abscissae represents the voltage $V_G$ applied to the gate terminal of the FeFET, whilst the axis of the ordinates (in logarithmic scale) represents the current $I_D$ that flows between the source terminal and the drain terminal as the voltage $V_G$ varies. A voltage value $V_G \approx V_{cc}$ corresponds to setting a first given state of polarization of the ferroelectric material of the FeFET, corresponding to a minimum value of current $I_D$, which can correspond to the low logic value ("0"); a voltage value $V_G \approx -V_{cc}$ corresponds to setting a second given state of polarization of the ferroelectric material of the FeFET (opposite to the first polarization state), corresponding to a maximum value of current $I_D$, which can be associated to the high logic value ("1").

Figure 1:
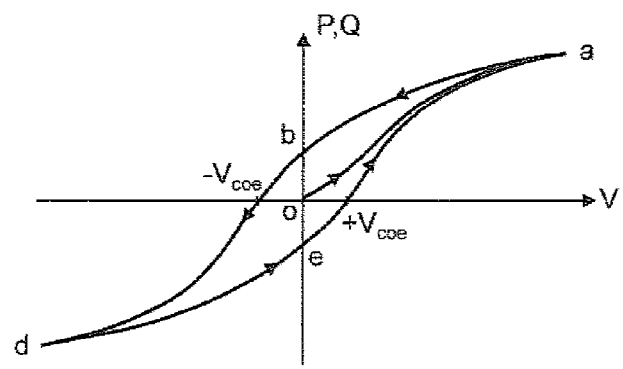
FIG. 1 is a plot representing a hysteresis cycle of a ferroelectric material of a storage medium.

The transition between the two polarization states follows a hysteresis curve, as already discussed with reference to FIG. 1.

Figure 5:
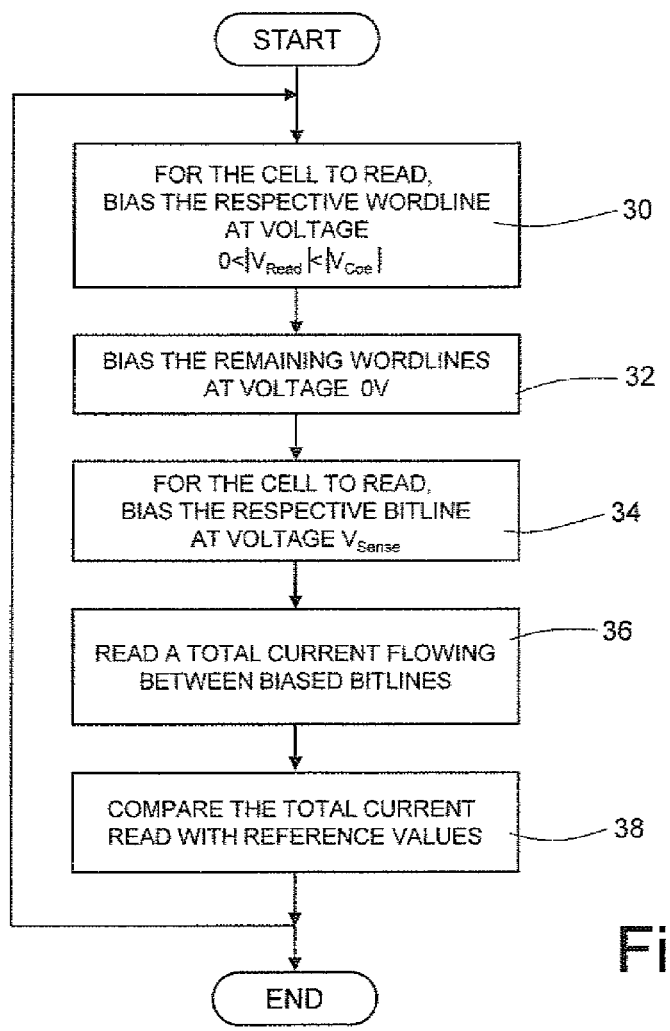
FIG. 5 shows steps of a method for non-destructive reading of memory cells of the memory portion of FIG. 2, according to the present invention.
Figure 6:
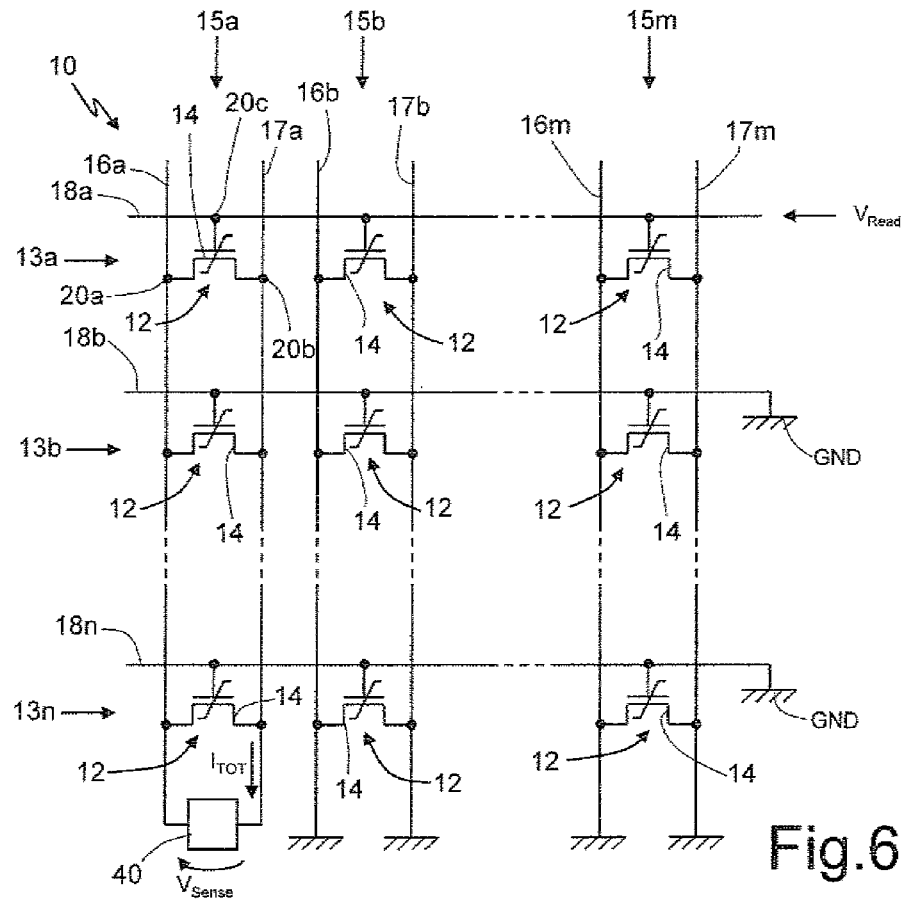
FIG. 6 shows the memory portion of FIG. 2 during a reading step according to the method of FIG. 5.
Figure 7A:
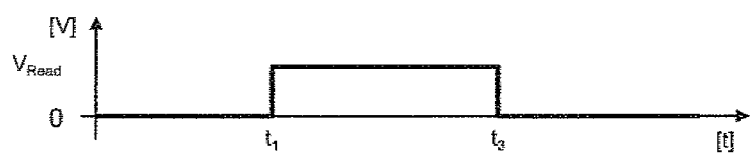
FIGS. 7a-7d show the plots of the voltage signals used for the reading steps according to the method of FIG. 5.
Figure 7B:
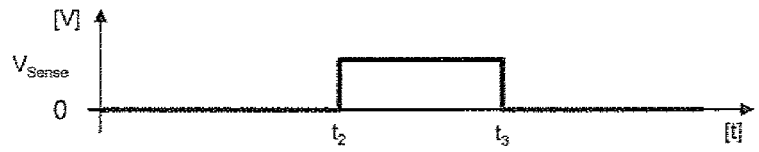
Figure 7C:
Figure 7D:

FIG. 5 shows, by means of a flowchart, steps of a method for non-destructive reading of the memory portion 10 of FIG. 2. FIG. 6 represents the memory portion 10 during reading of a memory cell 12, which represents voltage signals applied to the bitlines and to the wordlines for reading the memory cell 12 selected.

It is assumed, with reference to FIG. 6, that the memory cell 12 to be read is the memory cell 12 arranged at the intersection between the row 13a and the column 15a. For this purpose, the wordline 18a is biased (step 30 of FIG. 5) at a reading voltage $V_{read}$, such that $0 < |V_{read}| < |V_{coe}|$. In other words, the reading voltage $V_{read}$ must bias the gate terminal 20c of the transistor 14 of the memory cell 12 to be read to a voltage higher than 0 V and such as not to be higher than the coercive voltage $V_{coe}$ (which, as has been said, is positive or negative according to the logic datum written in the memory cell 12). In fact, if the coercive voltage $V_{coe}$ is exceeded ($|V_{read}| > |V_{coe}|$), the memory cell 12 would be rewritten (undesirable event). The wordlines of the remaining rows 13b-n are biased (step 32) to ground voltage (e.g., 0 V).

Then (step 34), by applying an appropriate voltage $V_{sense}$ between the bitlines 16a, 17a, it is possible to carry out an operation of detection of the current that flows between the source terminals 20a (connected to the bitline 16a) and the drain terminals 20b (connected to the bitline 17a) of the transistors 14 belonging to the column 15a. The voltage $V_{sense}$ has a value such that $(V_{sense} - V_{read}) < V_{coe}$. The remaining bitlines 16b-m, 17b-m are biased at ground voltage (e.g., 0 V).

Each transistor 14 belonging to the addressed column 15a shows a channel resistance of a high or low value, according to the state of polarization of the ferroelectric layer, corresponding to the logic value "0" or "1" stored (see FIG. 4). The current that flows between the source terminal 20a and drain terminal 20b of each transistor 14 is hence a function of the voltage applied to the respective gate terminal and of the state of polarization of the ferroelectric layer. The current $i_{TOT}$ that flows between the bitlines 16a and 17a is hence the total current that flows through all the transistors 14 (connected in parallel to one another) belonging to the column 15a and is not indicative, by itself, of the logic value stored in the memory cell 12 that is to be read. Said total current $i_{TOT}$ is read during step 36.

Then (step 37), the value read of total current $i_{TOT}$ is compared with a plurality of pre-defined reference current values, and, on the basis of said comparison, a decision is made on the logic value of the datum stored in the memory cell 12 (transistor 14) considered and addressed. Said step 37 is illustrated more fully in what follows by means of examples and with particular reference to FIGS. 8 and 9.

Biasing of the bitlines at a voltage $V_{sense}$ and reading of the total current $i_{TOT}$ are made by means of an appropriate circuit for biasing and reading of the current, as shown schematically in FIG. 6 and designated by the reference number 40.

FIGS. 7a-7d are schematic illustrations of the time plots of the signals used for biasing the bitlines and the wordlines. The voltage $V_{read}$ applied to the wordline 13a (FIG. 7a) has a boxcar waveform, with rising edge at time t1 and falling edge at time t3. The amplitude in voltage (axis of the ordinates) of the boxcar signal is equal to some volts (for example, of between 3 and 10 V, but these values can vary according to the physical characteristics of the transistors 14 used).

The voltage $V_{sense}$ applied to the bitlines 16a, 17a (FIG. 7b) also has a boxcar waveform, with rising edge at time t2, of a value comprised between t1 and t3.

The time interval t1-t2 is chosen so as to be longer than the transient for obtaining a correct biasing of the gate terminal 20c of the transistor 14 of the memory cell 12 to be read. In the interval t2-t3 also reading of the current $i_{TOT}$ is carried out according to step 36 of FIG. 5.

As has already been said, the remaining wordlines 13b-n (FIG. 7c) and bitlines 16b-m, 17b-m (FIG. 7d) are at ground voltage (e.g., 0 V).

In general, it should be noted that the wordlines 13b-n (FIG. 7c) and bitlines 16b-m, 17b-m (FIG. 7d) are biased at a reference voltage, which can be different from the ground voltage and from the value of 0 V.

As may be noted from the curve of FIG. 4, for voltages applied to the gate terminals 20c of the transistors 14 equal to 0 V, there is a non-zero passage of current between the respective source terminal 20a and drain terminal 20b. The value of the current that flows for zero gate voltages depends upon the state of polarization of the ferroelectric layer of each respective transistor 14 (i.e., upon the logic datum stored). For example, if in the memory cell 12 a logic value "0" is stored, the current $I_D$ that flows between the source terminal 20a and the drain terminal 20b has a low magnitude (indicatively, equal to a fraction of nanoamps, e.g. 0.7 nA); otherwise, in the case where a logic value "1" is stored, the current $I_D$ has a high magnitude (indicatively equal to some tens of nanoamps, e.g. 80 nA). It is evident that the exact values of the current $I_D$ depend upon the structure and upon the type of FeFET used, and can vary on the basis of the operating conditions (e.g., temperature of use) and/or for reasons linked to the steps of manufacture of the FeFETs (for example, the thicknesses of the layers, the doping values, the process spread, etc.).

It is moreover evident that as we move away from the zero voltage value on the gate, said values vary. In this regard, when in the memory cell 12 a logic value "1" is stored (condition of channel with low electrical resistance), and a voltage is applied on the gate equal to $V_{read}$ (e.g., $V_{read}$=5V), it is possible to appreciate a variation of the current that flows between the source and drain terminals for the transistor 14 of that memory cell 12 (for example, the current drops from approximately 80 nA to 40 nA).

Figure 8:
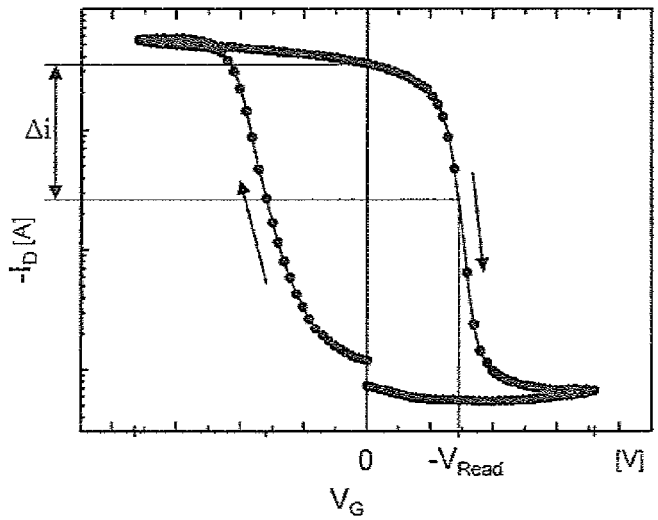
FIG. 8 represents the transcharacteristic curve of FIG. 2, which shows a variation of output current of the FeFET as a function of the voltage signals used for the reading steps according to the method of FIG. 5.

Reference may be made, for example, to FIG. 8. From the transcharacteristic curve of the output current of the FeFET it may be noted that the current value drops significantly (by a term $\Delta i$) when increasing the voltage on the gate beyond the value $v_G$=0 (if we consider that the axis of the abscissae is in logarithmic scale said variation is even more evident). From FIG. 8 it should moreover be noted that, given the same voltage $V_{read}$, the variation of current $I_D$ is also evident when in the memory cell 12 a logic value "0" is stored (condition of channel with high electrical resistance).

Figure 9:
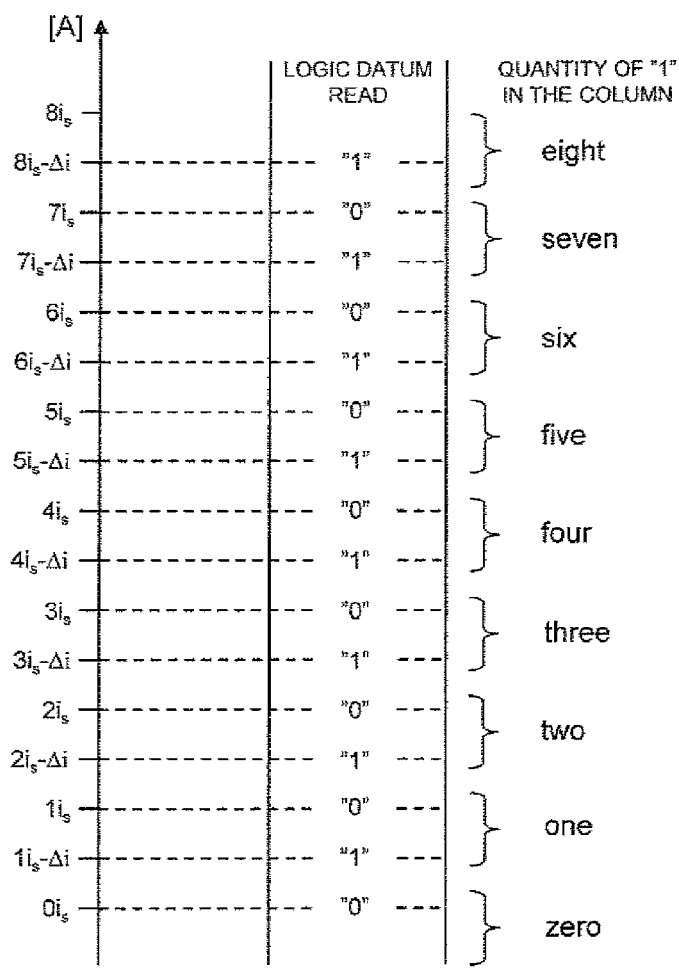
FIG. 9 is a graphic representation of the association existing between a logic datum stored in the memory cells belonging to one and the same column of the memory portion of FIG. 2 and a plurality of values of output current of said column, as a function of the number of memory cells that store a logic datum "1"

With reference to FIG. 9 represented graphically are all the possible ranges of values that the current $I_{TOT}$ can assume for a column considered of the memory portion 10 (for example, the column 15a of FIG. 2 or FIG. 6).

Assume that the current generated by a single transistor 14 has a nominal value $i_s$, the gate terminal 20c is biased at a voltage $V_G$=0 V, the source terminal 20a and drain terminal 20b present a difference of potential equal to $V_{sense}$, and the logic value stored is "1". The total current $i_{TOT}$ for that column is equal to $n \cdot i_s$. For example, assuming for simplicity a memory array having dimensions m=n=8, we have $i_{TOT}$=8·$i_s$.

The total current $i_{TOT}$ in the same aforementioned conditions but in the case where all the transistors store a logic value "0", has a low value, which for simplicity of description will be in what follows assumed to be zero. In particular, assumed to be zero (or in any case negligible, as is in actual fact the case) is the current that flows between source and drain of a transistor storing a logic value "0" and with gate terminal at a voltage $V_G$=0V.

It is hence possible to identify (see FIG. 9, axis of the ordinates) a plurality of values assumed by the current $i_{TOT}$ comprised between the limit values $0 \cdot i_S$ and $8 \cdot i_S$ (when $V_G$=0).

In detail, the value $1 \cdot i_S$ is assumed when in the column 15a-m considered of the memory portion 10 just one memory cell 12 having a logic value "1" is present, and the remaining memory cells 12 have a logic value "0". The value $2 \cdot i_S$ is assumed when in the column 15a-m considered two memory cells 12 that have a logic value "1" are present, and the remaining memory cells 12 have a logic value "0". The value $3 \cdot i_S$ is assumed when in the column 15a-m considered three memory cells 12 that have a logic value "1" are present, and the remaining memory cells 12 have a logic value "0". And so on, as far as the limit case $8 \cdot i_S$ already discussed (or in general $m \cdot i_S$, where all the memory cells 12 store a logic value "1").

Reading is carried out by applying the following criterion, illustrated on the basis of the example just discussed.

Assume the condition where all the transistors 14 store a logic value "1". As has been said, the total current $i_{TOT}$ with $V_G$=0 V is equal to $8 \cdot i_S$. To read the memory cell 12 set at the intersection between the row 13a and the column 15a a voltage is applied equal to $V_{read}$ to the wordline 18a. Consequently (as described with reference to FIG. 8), the current that flows between the source and drain terminals of that particular transistor varies significantly, and drops by a value $\Delta i$ (which depends upon the value of $V_{read}$ and upon the output transcharacteristic curve of the FeFET used). The value of total current $i_{TOT}$ is hence equal to $(8 \cdot i_S) - \Delta i$.

A similar reasoning applies in the case where one or more of the transistors 14 of the column considered 15a (but not the transistor 14 that is being read) stores a logic value "0". Biasing of the wordline 18a does not cause a variation $\Delta i$ of the value of total current $i_{TOT}$. For example, in the case where two zeros are present in the column considered, the value of $i_{TOT}$ varies from $6 \cdot i_S$ (case $V_G$=0) to $(6 \cdot i_S) - \Delta i$.

Instead, in the case where the transistor 14 that is being read stores a logic value "0", biasing of its gate terminal at a voltage $V_{read}$ does not cause a significant variation of the total current $i_{TOT}$, which hence remains at a substantially unaltered value.

Hence, for each memory cell 12 read (i.e., in which the gate terminal of the corresponding transistor 14 is biased at $V_{read}$), the total current $i_{TOT}$ assumes a value from among a plurality of pre-defined values (in particular the values indicated on the axis of the ordinates of the graph of FIG. 9), according to the logic values stored in the transistors 14 of the column considered.

By comparing the current value $i_{TOT}$ detected during reading with the pre-defined values 0, $1 \cdot i_S - \Delta i$, $1 \cdot i_S$, $2 \cdot i_S - \Delta i$, $2 \cdot i_S$, ..., $8 \cdot i_S - \Delta i$, it is possible to obtain the logic value of the datum stored in the memory cell 12 addressed.

It should be noted that the values $1 \cdot i_S - \Delta i$, $2 \cdot i_S - \Delta i$, $3 \cdot i_S - \Delta i$, $4 \cdot i_S - \Delta i$, $5 \cdot i_S - \Delta i$, $6 \cdot i_S - \Delta i$, $7 \cdot i_S - \Delta i$, and $8 \cdot i_S - \Delta i$ are assumed by the total current $i_{TOT}$ only in the presence of a logic value "1" in the memory cell 12 that is being read (i.e., of the cell biased at $V_{read}$). Consequently, the detection of one of said values (within an error margin) implies reading of a logic value "1". Likewise, the detection of one of the values 0, $1 \cdot i_S$, $2 \cdot i_S$, $3 \cdot i_S$, $4 \cdot i_S$, $5 \cdot i_S$, $6 \cdot i_S$, $7 \cdot i_S$ consequently implies reading of a logic value "0" in the memory cell 12 that is being read (i.e., of the cell biased at $V_{read}$).

According to one embodiment, the pre-defined values $0 \cdot i_S$, ..., $8 \cdot i_S$ can be stored in a static way in a further memory external to the memory portion 10, formed in an integrated way with the memory portion 10 in one and the same chip.

According to an alternative embodiment, said pre-defined values can be generated by an appropriate computer program (software) and updated dynamically during use of the memory, taking into account possible variations of current caused by variations of temperature or by other events.

According to a further embodiment, said pre-defined values can be generated by an appropriate generator circuit (hardware), formed in an integrated way in one and the same chip in which the memory portion 10 is formed.

Figure 10:
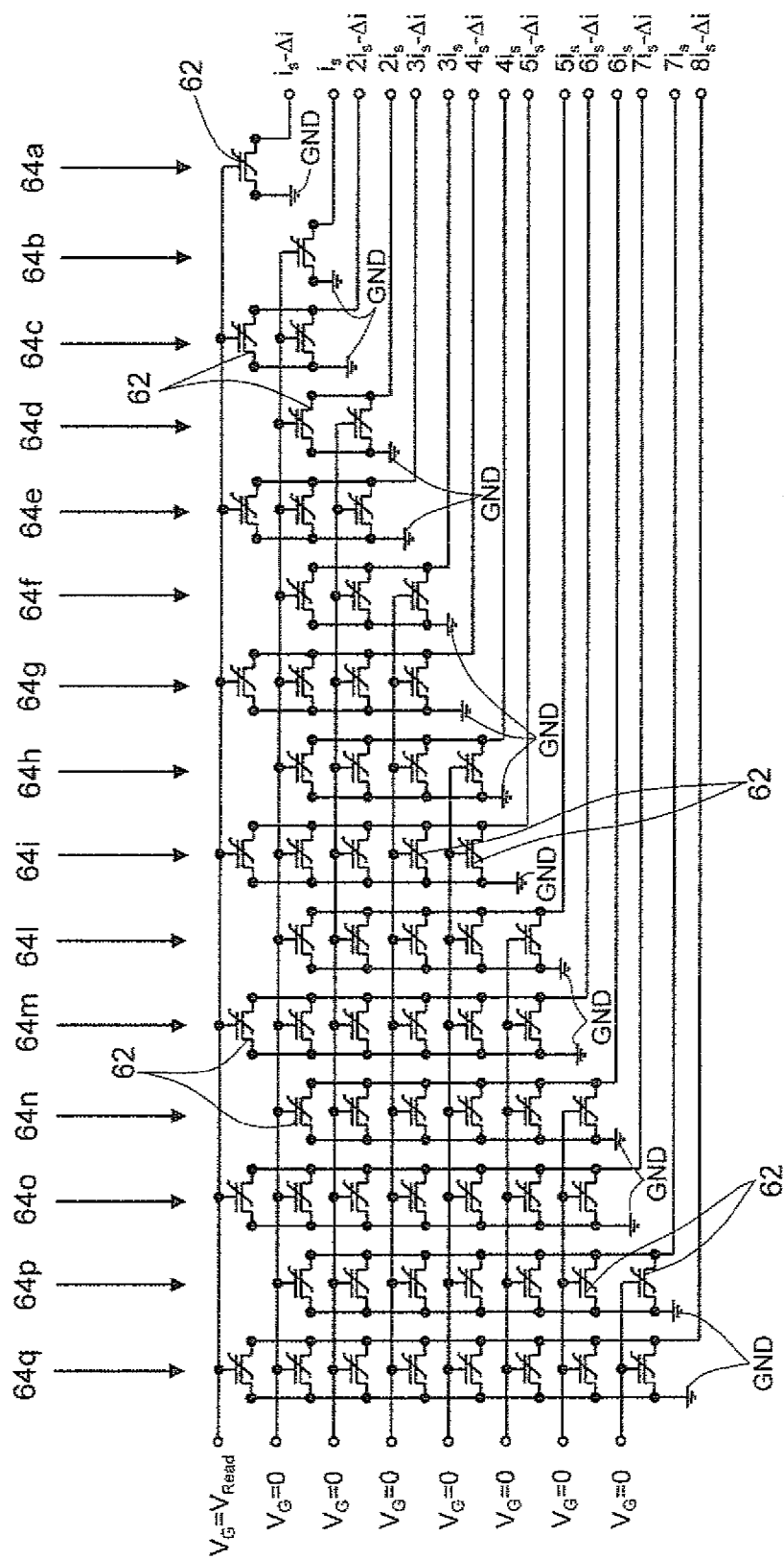
FIG. 10 shows a circuit for generating reference current values, according to the present invention.

FIG. 10 shows a circuit for generation of reference values 60, according to the present invention.

The circuit 60 comprises a plurality of transistors 62 of a FeFET type, and in particular of the same type as the transistors 14 used in the memory portion 10.

Each of the transistors 62 is pre-charged at a high logic value ("1").

The transistors 62 of the circuit 10 are connected to one another to form a plurality of columns 64a-64q. Each column comprises from one to eight transistors 62 (in general with reference to FIG. 2, from one to m transistors 62).

The transistors 62 belonging to one and the same column are connected in parallel to one another, and in particular have the respective source terminals connected to one another, and the respective drain terminals connected to one another.

Each column 64a-64q generates, at the level of the gate terminal of the last transistor 62 belonging to that column 64a-64q, one of the current values $1 \cdot i_S - \Delta i$, $1 \cdot i_S$, $2 \cdot i_S - \Delta i$, $2 \cdot i_S, \ldots, 8 \cdot i_S - \Delta i$.

For each of the columns 64a, 64c, 64e, 64g, 64i, 64m, 64o, and 64q, the gate terminal of just one of the transistors 62 belonging to the respective column is connected to a voltage $V_{read}$ whilst the gate terminals of the other transistors 62 are connected to a zero voltage. It should be noted that the column 64a is a particular case in so far as it comprises a single transistor 62, the gate terminal of which is biased at $V_{read}$.

For the remaining columns, the gate terminals of all the transistors 62 are biased at a zero voltage.

Moreover, the source terminals of all the transistors 62 of all the columns 64a-64q are connected to a ground terminal GND (e.g., approximately 0 V).

Reference current values are detected at the drain terminal of the last transistor 62 of each column 64a-64q.

For example, the column 64a, comprising a single transistor 62 storing the logic value "1" and biased at a gate voltage equal to $V_{read}$, generates the reference current value $1 \cdot i_S - \Delta i$. The column 64b, which also comprises a single transistor 62 storing the logic value "1" but biased at a gate voltage equal to 0 V, generates the reference current value $1 \cdot i_S$. The column 64c, which comprises two transistors 62, which store the logic value "1" and of which one is biased at a gate voltage $V_{read}$ whilst the other is biased at a gate voltage 0 V, generates the reference current value $2 \cdot i_S - \Delta i$. And so on.

In general, the generic reference current value $m \cdot i_S - \Delta i$ is generated by a plurality of m transistors 62 connected in parallel to one another (each storing a logic value "1"), and in which one of said transistors 62 is biased at a gate voltage $V_{read}$, whilst the remaining m−1 transistors 62 are biased at a gate voltage equal to 0 V.

The generic reference current value $m \cdot i_S$ is instead generated by a plurality of m transistors 62 connected in parallel to one another (each storing a logic value "1"), and in which each of said transistors 62 is biased at a gate voltage equal to 0 V.

Figure 11:
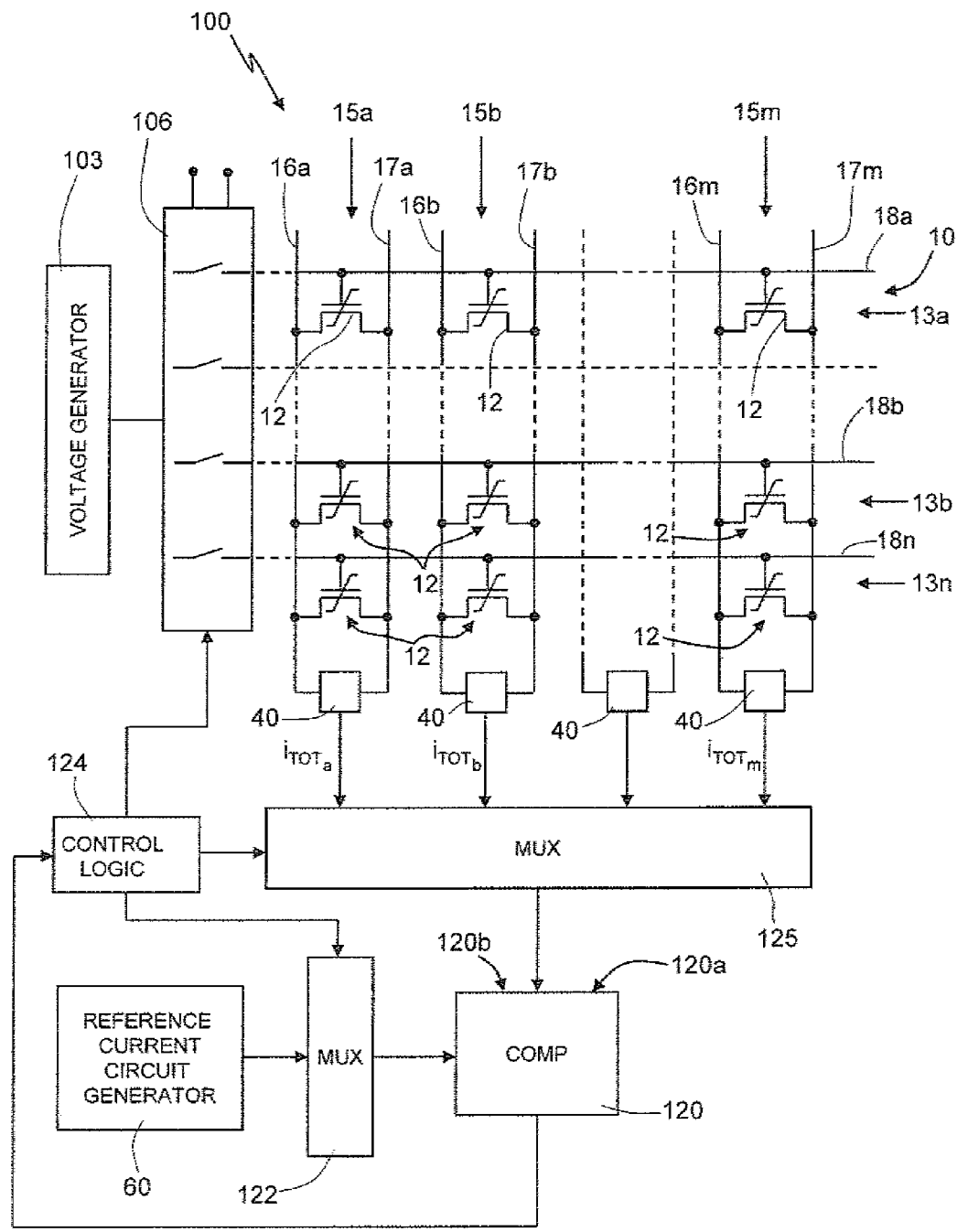
FIG. 11 shows a memory comprising the memory portion of FIG. 2.

FIG. 11 shows an architecture of a memory 100, which comprises the memory portion 10 of FIG. 2 and the circuit for generation of reference values 60 of FIG. 10.

The memory 100 further comprises a row decoder 106, connected to the wordlines 18a-n of each row 13a-n, designed to connect appropriately the wordlines to a voltage-generator block 103 (or to ground voltage) configured for biasing, according to the steps of the method of FIG. 5, the wordlines 18a-n at the operating voltages.

For the column 15a-m that is to be read, the current $i_{TOT}$ detected by the biasing and reading circuit 40 (a plurality of biasing and reading circuits 40 is shown in FIG. 11, one for each column 15a-m) is supplied at input to a first input 120a of a comparator 120. A second input 120b of the comparator 120 receives one of the reference currents generated by means of the circuit 60 of FIG. 10.

Alternatively, each biasing and reading circuit 40 comprises a sense amplifier, configured for receiving the current $i_{TOT}$ and converting it into a voltage value. Likewise, also the reference current value generated by the circuit 60 is converted into a voltage value by means of an appropriate converter, for example a "sense amplifier" of the same type used in the biasing and reading circuit 40. The two voltage values thus obtained are a function of the respective values of current and are sent to the respective inputs of the comparator 120, which in this case is a voltage comparator.

For this purpose, a multiplexer 122 is set between the circuit 60 and the second input 120b of the comparator 120 and is configured for selecting in series (sequentially selecting), in use, the reference signals (as has been said, in current or voltage) generated by the circuit 60. Likewise, a further multiplexer 125 is set between the first input 120a of the comparator 120 and the plurality of biasing and reading circuits 40, and is configured for coupling the output of just one of the biasing and reading circuits 40 (i.e., the biasing and reading circuit 40 for the column that comprises the memory cell 12 that is to be read) to the first input 120a of the comparator 120.

The output of the comparator 120 is connected to a control logic 124, configured for receiving the comparison signal generated by the comparator 120 and identifying, on the basis of said comparison signal, a possible correspondence between the value of total current $i_{TOT}$ and one of the reference current values generated by the circuit 60. The correspondence is verified within a certain error margin.

The control logic 124 is moreover operatively connected to the multiplexer 122 and 125 and to the row decoder 106, for controlling their operation, for example on the basis of the signal received from the comparator 120, contributing to implementing the steps of the method of FIG. 5. For example, in the case where a substantial equality, within the error margin, is detected between the current value $i_{TOT}$ and a reference current value, the control logic 124 can interrupt the comparison step. A subsequent memory cell 12 may then be read.

It is evident that solutions are possible alternative to the one shown in the figure. For example, it is possible to use a single biasing and reading circuit 40, which can be controlled so as to be coupled, alternatively, to just one of the columns 15a-m of the memory portion 10. In this case, a multiplexer is set (in a way not shown) between the memory portion 10 and the single biasing and reading circuit 40, the output of which is directly connected to the input 120a of the comparator 120. The multiplexer 125, set between the comparator and the biasing and reading circuits 40, is not necessary in this latter embodiment.

From an examination of the characteristics of the invention provided according to the present disclosure the advantages that it affords are evident.

In particular, the reading operation described is non-destructive, in so far as it is based upon the application of reading pulses with amplitude lower than the coercive voltage of the ferroelectric material so that the polarization of the material returns in the starting stable state once the operation of reading of the data has terminated. Given that the reading operation does not cause erasure of the data stored, the presence of a data-storage buffer and re-writing of the data read is not necessary.

In addition, even though the circuit for generation of reference values 60 occupies area, the saving of area due to the memory architecture of a 1T type makes up for this disadvantage.

Finally, it is clear that modifications and variations may be made to what has been described and illustrated herein without thereby departing from the sphere of protection of the present invention, as defined in the annexed claims.

For example, the reading step can be carried out in a way similar to what has been described using a negative voltage $V_{read}$, and hence operating on the rising portion of the hysteresis curve. In this case, the presence of a value "0" stored in the memory cell 12 that is to be read will cause an increase of the current between source and drain of the respective memory cell 12; instead, the presence of a value "0" stored in the memory cell 12 that is to be read will cause a non-significant variation of the current between source and drain of the respective memory cell 12.

That which is claimed is:

1. A method for non-destructive reading of data stored in a memory including a first wordline, a first bitline, a second bitline, and a first ferroelectric transistor, the first ferroelectric transistor having a first conduction terminal coupled to the first bitline, a second conduction terminal coupled to the second bitline, and a control terminal coupled to the first wordline, the first ferroelectric transistor comprising a layer of ferroelectric material in a stable state of polarization capable of assuming high and low logic values; and a second wordline and a second ferroelectric transistor, the second ferroelectric transistor having a first conduction terminal coupled to the first bitline, a second conduction terminal coupled to the second bitline, and a control terminal coupled to the second wordline, the second ferroelectric transistor comprising a layer of ferroelectric material in a stable state of polarization and capable of assuming a high logic value and a low logic value, the method comprising:
    biasing the control terminal of the first ferroelectric transistor to a first biasing value by applying to the first wordline a reading voltage so as to not cause a variation of the stable state of polarization of the layer of ferroelectric material;
    generating a sense voltage between the first and second bitlines;
    generating a current value of a current that flows between the first and second bitlines;
    comparing the current value to a plurality of comparison, values indicative of a respective number of logic data that have a high logic value or a low logic value for a column of the ferroelectric memory including the first and second ferroelectric transistors; and
    determining a logic value of the data based upon the comparison.

2. The method according to claim 1, further comprising:
    applying to the second wordline a reference voltage by biasing the control terminal of the second ferroelectric transistor to a second biasing value that is lower, in absolute value, than the first biasing value, and is such as to not cause a variation of the stable state of polarization of the layer of ferroelectric material;
    determining a decremental value with respect to a comparison value that is closest to the current value; and
    determining the logic value of the data based upon the decremental value.

3. The method according to claim 1 further comprising:
    applying to the second wordline a reference voltage by biasing the control terminal of the second ferroelectric transistor to a second biasing value that is lower, in absolute value, than the first biasing value, and is such as to not cause a variation of the stable state of polarization of the layer of ferroelectric material;
    determining an incremental value with respect to a comparison value that is closest to the current value; and
    determining the logic value of the data to be read based upon the incremental value.

4. The method according to claim 3, wherein the reference voltage is ground.

5. The method according to claim 2, wherein the current value represents a current that flows between the first and second conduction terminals of the first and second ferroelectric transistors.

6. A method for non-destructive reading of data stored in a memory including a first wordline, a first bitline, a second bitline, and a first ferroelectric transistor, the first ferroelectric transistor having a first conduction terminal coupled to the first bitline, a second conduction terminal coupled to the second bitline, and a control terminal coupled to the first wordline, the first ferroelectric transistor comprising a layer of ferroelectric material in a stable state of polarization capable of assuming high and low logic values; and a second wordline and a second ferroelectric transistor, the second ferroelectric transistor having a first conduction terminal coupled to the first bitline, a second conduction terminal coupled to the second bitline, and a control terminal coupled to the second wordline, the second ferroelectric transistor comprising a layer of ferroelectric material in a stable state of polarization and capable of assuming a high logic value and a low logic value, the method comprising:
    biasing the control terminal of the first ferroelectric transistor to a first biasing value by applying to the first wordline a reading voltage so as to not cause a variation of the stable state of polarization of the layer of ferroelectric material;
    generating a current value of a current that flows between the first and second bitlines; and
    comparing the current value to a plurality of comparison values indicative of a respective number of logic data that have a high logic value or a low logic value for a column of the ferroelectric memory including the first and second ferroelectric transistors; and
    determining a logic value of the data based upon the comparison.

7. The method according to claim 6, further comprising:
    applying to the second wordline a reference voltage by biasing the control terminal of the second ferroelectric transistor to a second biasing value that is lower, in absolute value, than the first biasing value, and is such as to not cause a variation of the stable state of polarization of the layer of ferroelectric material;
    determining a decremental value with respect to a comparison value that is closest to the current value; and
    determining the logic value of the data based upon the decremental value.

8. The method according to claim 6, further comprising:
applying to the second wordline a reference voltage by biasing the control terminal of the second ferroelectric transistor to a second biasing value that is lower, in absolute value, than the first biasing value, and is such as to not cause a variation of the stable state of polarization of the layer of ferroelectric material;
determining an incremental value with respect to a comparison value that is closest to the current value; and
determining the logic value of the data to be read based upon the incremental value.

9. The method according to claim 8, wherein the reference voltage is ground.

10. The method according to claim claim 6, wherein the current value represents a current that flows between the first and second conduction terminals of the first and second ferroelectric transistors.

11. A ferroelectric memory comprising:
a first wordline;
a first bitline;
a second bitline;
a first ferroelectric transistor including a layer of ferroelectric material in a stable state of polarization and capable of assuming high and low logic values, and comprising a first conduction terminal coupled to the first bitline, a second conduction terminal coupled to the second bitline, and a control terminal coupled to the first wordline;
a second wordline;
a second ferroelectric transistor having a first conduction terminal coupled to the first bitline, a second conduction terminal coupled to the second bitline, and a control terminal coupled to the second wordline, and comprising a layer of ferroelectric material in a stable state of polarization and capable of assuming high and low logic values;
a bias generator to generate a reading voltage, coupled to the first wordline, and configured for biasing, via the first wordline, the control terminal of the first ferroelectric transistor to a first biasing value so as not to cause a variation of the stable state of polarization of the layer of ferroelectric material;
a sense generator to generate a sense voltage, and coupled between the first and second bitlines;
a reading and comparison circuit coupled to at least one of the first bitline and the second bitline, configured to read a current value of a current that flows between the first and second bitlines, and to compare the current value to a plurality of comparison values indicative of a respective number of logic data that have a high logic value or a low logic value for a column of the ferroelectric memory including the first and second ferroelectric transistors; and
control logic circuitry coupled to the reading and comparison circuit and configured to determine a logic value of the data to be read based upon the comparison.

12. The memory according to claim 11, wherein said bias generator is coupled to the second wordline and is configured for biasing the control terminal of the second ferroelectric transistor at a second biasing value that is lower, in absolute value, than the first biasing value, and is such as to not cause a variation of the stable state of polarization of the layer of ferroelectric material; and further comprising
a circuit for generating the plurality of comparison values; and
the control logic circuitry being configured for determining a decremental value with respect to a comparison value that is closest to the current value and determining the logic value of the data to be read based upon the decremental value.

13. The memory according to claim 11, wherein said bias generator is coupled to the second wordline and configured for biasing the control terminal of the second ferroelectric transistor to a second biasing value that is lower, in absolute value, than the first biasing value, and is such as not to cause a variation of the stable state of polarization of the layer of ferroelectric material; further comprising
a circuit for generation of the plurality of comparison values; and
the control logic circuitry configured for determining an incremental value with respect to the comparison value that is closest to the current value and determining a logic value of the data to be read on the basis of the incremental value.

14. The memory according to claim 11, wherein the current value represents current that flows between the first and second conduction terminals of the first and second ferroelectric transistors.

* * * * *

UNITED STATES PATENT AND TRADEMARK OFFICE
CERTIFICATE OF CORRECTION

PATENT NO. : 8,767,436 B2  Page 1 of 1
APPLICATION NO. : 13/362478
DATED : July 1, 2014
INVENTOR(S) : Scalia et al.

It is certified that error appears in the above-identified patent and that said Letters Patent is hereby corrected as shown below:

In the Claims

Column 11, Line 56-57    Delete: "comparison, values"
                         Insert: --comparison values--

Column 13, Line 14       Delete: "claim claim"
                         Insert: --claim--

Signed and Sealed this
Seventh Day of July, 2015

Michelle K. Lee
*Director of the United States Patent and Trademark Office*